(12) United States Patent
Harley et al.

(10) Patent No.: US 11,081,583 B2
(45) Date of Patent: Aug. 3, 2021

(54) FINFET WITH DIELECTRIC ISOLATION AFTER GATE MODULE FOR IMPROVED SOURCE AND DRAIN REGION EPITAXIAL GROWTH

(71) Applicant: INTERNATIONAL BUSINESS MACHINES CORPORATION, Armonk, NY (US)

(72) Inventors: Eric C. Harley, Lagrangeville, NY (US); Judson R. Holt, Wappingers Falls, NY (US); Yue Ke, Fishkill, NY (US); Rishikesh Krishnan, Poughkeepsie, NY (US); Keith H. Tabakman, Newburgh, NY (US); Henry K. Utomo, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/665,338

(22) Filed: Oct. 28, 2019

(65) Prior Publication Data

US 2020/0066908 A1 Feb. 27, 2020

Related U.S. Application Data

(60) Division of application No. 15/070,515, filed on Mar. 15, 2016, now Pat. No. 10,615,279, which is a
(Continued)

(51) Int. Cl.
*H01L 29/78* (2006.01)
*H01L 29/66* (2006.01)
(Continued)

(52) U.S. Cl.
CPC .. *H01L 29/7848* (2013.01); *H01L 21/823814* (2013.01); *H01L 21/823821* (2013.01);
(Continued)

(58) Field of Classification Search
CPC .................................................. H01L 29/66795
See application file for complete search history.

(56) References Cited

U.S. PATENT DOCUMENTS 7,655,533 B2   2/2010  Sheen et al.
8,053,299 B2  11/2011  Xu
(Continued)

OTHER PUBLICATIONS

List of IBM Patents or Patent Applications Treated as Related dated Oct. 28, 2019, 2 pages.

*Primary Examiner* — Robert T Huber
*Assistant Examiner* — Xia L Cross
(74) *Attorney, Agent, or Firm* — Tutunjian & Bitetto, P.C.; L. Jeffrey Kelly

(57) ABSTRACT

A device and method for forming a semiconductor device includes forming a gate structure on a channel region of fin structures and forming a flowable dielectric material on a source region portion and a drain region portion of the fin structures. The flowable dielectric material is present at least between adjacent fin structures of the plurality of fin structures filling a space between the adjacent fin structures. An upper surface of the source region portion and the drain region portion of fin structures is exposed. An epitaxial
(Continued)

semiconductor material is formed on the upper surface of the source region portion and the drain region portion of the fin structures.

10 Claims, 9 Drawing Sheets

Related U.S. Application Data continuation of application No. 14/287,761, filed on May 27, 2014, now Pat. No. 9,312,364.

(51) Int. Cl.
| | |
|---|---|
| H01L 29/06 | (2006.01) |
| H01L 21/8238 | (2006.01) |
| H01L 27/092 | (2006.01) |
| H01L 29/08 | (2006.01) |
| H01L 29/16 | (2006.01) |
| H01L 29/161 | (2006.01) |
| H01L 29/165 | (2006.01) |

(52) U.S. Cl.
CPC .. *H01L 21/823878* (2013.01); *H01L 27/0924* (2013.01); *H01L 29/0653* (2013.01); *H01L 29/0847* (2013.01); *H01L 29/161* (2013.01); *H01L 29/165* (2013.01); *H01L 29/1608* (2013.01); *H01L 29/66545* (2013.01); *H01L 29/66636* (2013.01); *H01L 29/66795* (2013.01); *H01L 29/785* (2013.01)

(56) References Cited

U.S. PATENT DOCUMENTS

| | | | |
|---|---|---|---|
| 8,310,013 B2 | 11/2012 | Lin et al. | |
| 8,377,759 B2 | 2/2013 | Cheng et al. | |
| 8,441,072 B2 | 5/2013 | Tsai et al. | |
| 8,552,477 B2 | 10/2013 | Zhu | |
| 8,629,420 B1 | 1/2014 | Shrivastava et al. | |
| 9,917,190 B2* | 3/2018 | Harley | H01L 29/66795 |
| 10,243,077 B2* | 3/2019 | Harley | H01L 29/66795 |
| 2005/0250285 A1* | 11/2005 | Yoon | H01L 21/84 |
| | | | 438/283 |
| 2005/0272190 A1 | 12/2005 | Lee et al. | |
| 2008/0079076 A1* | 4/2008 | Sheen | H01L 29/66795 |
| | | | 257/349 |
| 2011/0210393 A1 | 9/2011 | Chen et al. | |
| 2012/0018730 A1* | 1/2012 | Kanakasabapathy | |
| | | | H01L 27/0886 |
| | | | 257/66 |
| 2012/0091538 A1* | 4/2012 | Lin | H01L 29/66795 |
| | | | 257/401 |
| 2013/0069171 A1 | 3/2013 | Cheng et al. | |
| 2013/0193446 A1 | 8/2013 | Chao et al. | |
| 2013/0230958 A1 | 9/2013 | Lee et al. | |
| 2013/0316509 A1* | 11/2013 | Qin | H01L 29/6653 |
| | | | 438/289 |

* cited by examiner

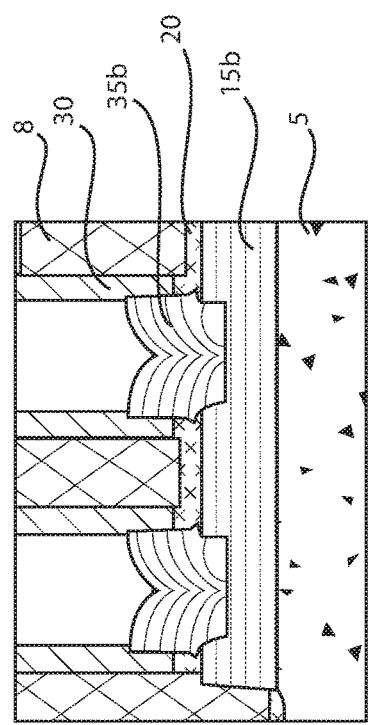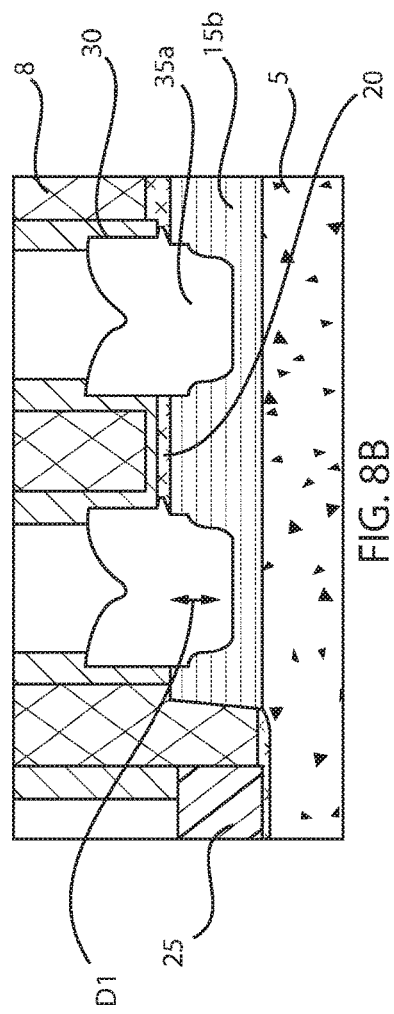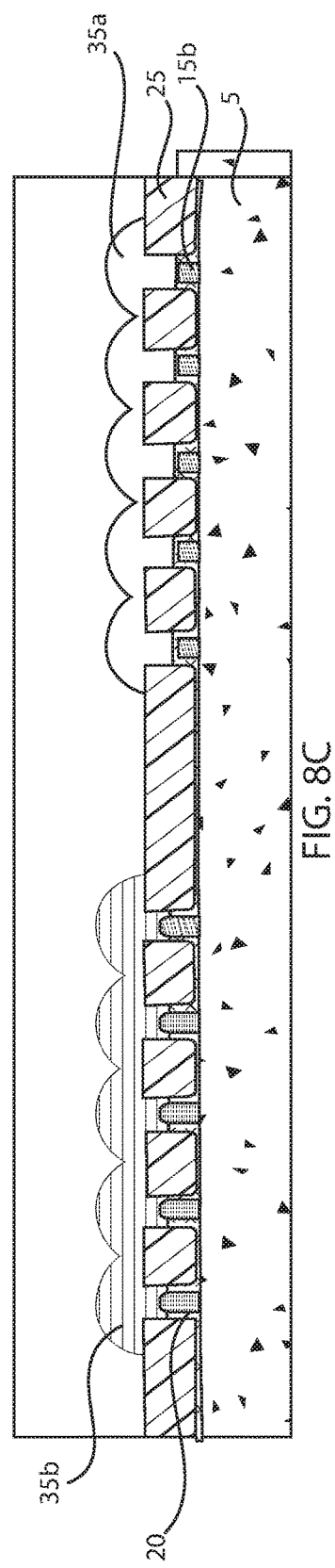

FINFET WITH DIELECTRIC ISOLATION AFTER GATE MODULE FOR IMPROVED SOURCE AND DRAIN REGION EPITAXIAL GROWTH

BACKGROUND

Technical Field

The present disclosure relates to semiconductor devices, such as semiconductor devices including fin structures.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (finFET).

SUMMARY

In one aspect, a method is disclosed for forming a semiconductor device that includes forming a gate structure on a channel region of a plurality of fin structures. A flowable dielectric is then deposited on a source region portion and a drain region portion of the plurality of fin structures, wherein the flowable dielectric is present at least between adjacent fin structures of the plurality of fin structures filling a space between said adjacent fin structures. In a following step, an upper surface of the source region portion and the drain region portion of the fin structures is exposed. An epitaxial semiconductor material is formed on the upper surface of the source region portion and the drain region portion of the plurality of fin structures.

In another aspect, a method of forming a semiconductor device is provided that includes forming a gate structure on a channel region of a plurality of fin structures. A dielectric layer is formed on a source region portion and a drain region portion of the plurality of fin structures. A flowable dielectric is then deposited on the source region portion and the drain region portion of the plurality of fin structures over the dielectric layer. The flowable dielectric is present at least between adjacent fin structures of the plurality of fin structures filling a space between the adjacent fin structures. In a following step, an upper surface of the source region portion and the drain region portion of the fin structures is exposed by etching the dielectric layer. The upper surface of the dielectric layer may then be recessed. An epitaxial semiconductor material is formed on the upper surface of the source region portion and the drain region portion of the plurality of fin structures that has been recessed.

In another embodiment, a semiconductor device is provided that includes a gate structure present on a channel region portion of a plurality of fin structures. A flowable dielectric is present filling the space between adjacent fin structures in the plurality of fin structures. Epitaxial source and drain merge structures are present on an exposed upper surface of the fin structures, wherein the epitaxial source and drain merge structures extend over the flowable dielectric that is present filling the space between adjacent fin structures.

BRIEF DESCRIPTION OF DRAWINGS

The following detailed description, given by way of example and is not intended to limit the disclosure solely thereto, will best be appreciated in conjunction with the accompanying drawings, wherein like reference numerals denote like elements and parts, in which:

FIG. 8A is a cross-sectional side view parallel to a length of the gate structure depicting the first epitaxial semiconductor material on the fin structure that is depicted in FIG. 7, in accordance with one embodiment of the present disclosure.

FIG. 8B is a cross-sectional side view perpendicular to a length of the gate structure depicting a cross-section of the second epitaxial semiconductor material on the fin structure that is depicted in FIG. 7, in accordance with one embodiment of the present disclosure.

FIG. 8C is a cross-sectional side view parallel to the length of the gate structure depicting the first and second epitaxial semiconductor materials on the fin structures depicted in FIG. 7, in accordance with one embodiment of the present disclosure.

DETAILED DESCRIPTION OF THE PREFERRED EMBODIMENTS

Figure 1:
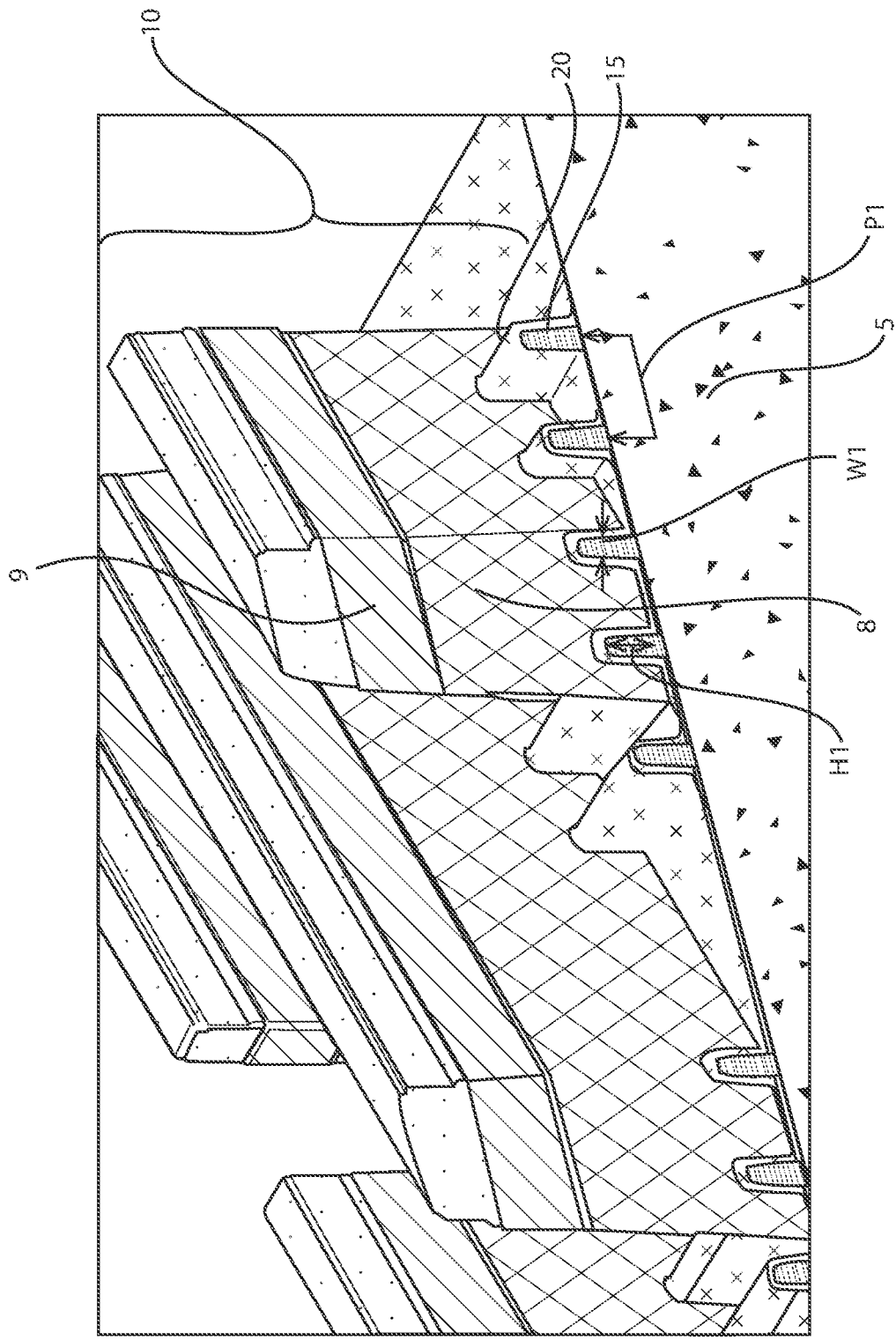
FIG. 1 is a perspective cross-sectional view depicting forming a gate structure on a plurality of fin structures, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements. As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A Fin Field Effect Transistor (FinFET) is a semiconductor device that positions the channel region of the semiconductor device in a fin structure.

In some embodiments, the methods and structures disclosed herein introduce a flowable dielectric into the space separating adjacent fin structures after the gate module step of the process flow. In some embodiments, the flowable dielectric may be deposited so that it covers an entirety of the fin structures, wherein the flowable dielectric is recessed following deposition so that the upper surface of the fin structure is exposed. Epitaxial semiconductor material may then be grown on the upper surface of the fin structures. In some embodiments, by covering the lower part of the fin structure, the fin structure is protected against contamination during the etch processes, such as reactive ion etch (RIE) processes, that are used to form the gate sidewall spacer. Further, by limiting the number of epitaxial semiconductor crystal growth planes that are available, the methods and structures that are disclosed herein allow for an epitaxial process with improved performance, such as improved crystal quality or better selectivity. Moreover, by forming a layered epitaxial semiconductor material that includes a buffer layer portion, a main portion and a cap layer portion, improved control can be gained over critical device parameters, such as junction profile and resistance. In some embodiments, by constraining the epitaxial growth so that the semiconductor material does not extend down the sidewalls of the fin structures, the methods and structures disclosed herein may limit the source and drain region to gate capacitance. The methods and structures of the present disclosure are now discussed with more detail referring to FIGS. 1-9.

FIG. 1 depicts one embodiment of forming gate structures 10 on a plurality of fin structures 15. The material that provides the fin structures 15 may be a silicon-containing material, such as single crystal silicon (Si), monocrystalline silicon (Si), polycrystalline silicon (Si) or a combination thereof. In some embodiments, the fin structure 15 may be formed from a semiconductor on insulator (SOI) substrate, in which the upper layer of the SOI substrate, i.e., SOI layer, provides the material for the fin structures 15, and the buried dielectric layer of the SOI substrate provides the material for the dielectric surface 5 that the fin structures 15 are present on. In some embodiments, in which an SOI substrate is used for forming the fin structures 15 and the dielectric surface 5, a base semiconductor substrate (not shown) may be present underlying the material layer that provides the dielectric surface 5. The base semiconductor substrate may comprise at least one of Si, Ge, SiGe alloys, SiGe:C, SiC, Si:C, GaAs, InAs, InP, as well as other III/V or II/VI compound semiconductors. The base semiconductor substrate is optional, and may be omitted. In other embodiments, the fin structures 15 and the dielectric surface 5 can be formed using a bulk semiconductor substrate or a dielectric isolated wafer. It is noted that the above description of substrates suitable for forming the fin structure 15 and the dielectric surface 5 are provided for illustrative purposes only, and are not intended to limit the present disclosure. For example, the fin structures 15 and the dielectric surface 5 may be provided by any arrangement that provides a semiconductor material that is present on a dielectric surface 5 so that the semiconductor material may be processed to provide the fin structures 15.

The fin structures 15 may be formed using photolithography and etch processes. For example, the fin structures 15 may be formed using sidewall image transfer (SIT) methods. More specifically, in one example of a SIT method, a photoresist mandrel is first formed on a surface of the semiconductor material of the substrate that is processed to provide the fin structures 15, e.g., etching the SOI layer of an SOI substrate. The photoresist mandrel may be formed using deposition, patterning and development processes. Thereafter, a low-pressure chemical vapor (isotropic) deposition provides a dielectric profile on the sidewalls of the photoresist mandrel. The photoresist mandrel may then be removed. For example, photoresist mandrel can be removed using a chemical strip or selective etching. Following removal of the photoresist mandrel, the dielectric profile remains to provide an etch mask. The semiconductor material is then etched using the dielectric profile as an etch mask to provide the fin structures 15. The etch process for forming the fin structures 15 may be an anisotropic etch, such as reactive ion etching (RIE). In the embodiments that employ an SOI substrate to provide the fin structures 15, the etch process may be continued until an entire thickness of the SOI layer is removed so that the portions of the SOI layer that are not etched provide the fin structures 10.

In some embodiments, each of the fin structures 15 may have a height $H_1$ ranging from 5 nm to 200 nm. In another embodiment, each of the fin structures 15 has a height $H_1$ ranging from 10 nm to 100 nm. In one example, each of the fin structures 15 may have a height $H_1$ ranging from 20 nm to 60 nm. Each of the fin structures 15 may have a width $W_1$ of less than 20 nm. In another embodiment, each of the fin structures 5 has a width $W_1$ ranging from 3 nm to 12 nm. The pitch P1 separating adjacent fin structures 15 may range from 10 nm to 500 nm. In another example, the pitch P1 separating adjacent fin structures 15 may range from 20 nm to 50 nm.

FIG. 1 further depicts one embodiment of forming a gate structure 10 on a channel portion of the fin structures 15. The gate structure 10 functions to switch the semiconductor device from an "on" to "off" state, and vice versa. The gate structure 10 typically includes at least one gate dielectric (not shown) and at least one gate conductor 8. The at least one gate dielectric may be composed of an insulator, and is present around the channel region of the fin structure 15, and the at least one gate conductor 8 is composed of an electrically conductive material, and is present on at least one gate dielectric. A gate dielectric cap 9 may be present atop the at least one gate conductor 8.

The gate structure 10 may be formed by forming blanket material layers for the at least one gate dielectric, the at least one gate conductor 8, and the at least one gate dielectric cap 9 to provide a gate stack, and patterning and etching the gate stack to provide the gate structure 10 utilizing photolithography and etch process steps. The photolithography and etch processes for forming the gate structure 10 is similar to the photolithography and etch processes that have been described above for forming the fin structures 15.

The at least one gate dielectric is typically positioned on at least a portion of the upper surface and sidewall of the fin structure 15. The at least one gate dielectric may be formed by a thermal growth process such as, e.g., oxidation, nitridation or oxynitridation, or may be formed using a deposition process, such as chemical vapor deposition (CVD). In some embodiments, the at least one gate dielectric is composed of a high-k dielectric material. High-k dielectric materials have a dielectric constant greater than silicon oxide ($SiO_2$) at room temperature, e.g., 25° C. For example, a high-k dielectric composed of hafnium oxide ($HFO_2$) may have a dielectric constant of 16.0 or greater. The physical thickness of the at least one gate dielectric may vary, but typically, the at least one gate dielectric has a thickness ranging from 1 nm to 10 nm.

The at least one gate conductor 8 may be composed of polysilicon, silicon germanium (SiGe), a silicide, a metal or a metal-silicon-nitride, such as Ta—Si—N. Examples of metals that can be used as the at least one gate conductor 8 include, but are not limited to Al, W, Cu, Ti or other like conductive metals. The physical thickness of the at least one gate conductor 8 may range from 5 nm to 100 nm. The gate dielectric cap 9 may be composed of a nitride, oxide, oxynitride material, and/or any other suitable dielectric layer.

In the process flow provided in the supplied figures, the gate structure 10 is formed using a gate first process flow. In a gate first process flow, the gate structure 10 is formed prior to forming the source and drain regions. Although not depicted in the supplied figures, a gate last process flow is equally applicable to the present disclosure. In a gate last process flow, a sacrificial gate structure, i.e., replacement gate structure, is formed prior to forming the source and drain regions, wherein the replacement gate structure defines the geometry of the later formed functional gate structure. In a gate last process flow, following the formation of the source and drain regions, the replacement gate structure is removed, and a functional gate structure is formed in its place.

Still referring to FIG. 1, in some embodiments, a dielectric layer 20 may be deposited on the exposed portions of the fin structures 15. The dielectric layer 20 may be blanket deposited on the fin structures 15 and the portion of the dielectric surface 5 that is present between adjacent fin structures 15. The dielectric layer 20 is typically composed of an oxide, oxynitride or nitride material, but other dielectric materials are equally suitable for the dielectric layer 20. For example, the dielectric layer 20 may be composed of silicon oxide or silicon oxynitride. The dielectric layer 20 typically has a conformal thickness, and is deposited using a conformal deposition process. The term "conformal" denotes a layer having a thickness that does not deviate from greater than or less than 30% of an average value for the thickness of the layer. In one embodiment, the thickness of the dielectric layer 20 may range from 2 nm to 20 nm. In another embodiment, the thickness of the dielectric layer 20 may range from 3 nm to 10 nm. It is noted that the above description for the thickness of the dielectric layer 20 is provided for illustrative purposes only, and is not intended to limit the present disclosure, as other thicknesses have also been contemplated for use herein.

The dielectric layer 20 may be deposited using a chemical vapor deposition (CVD) method. Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed. The dielectric layer 20 may also be formed using thermal growth processes, such as thermal oxidation.

Figure 2:
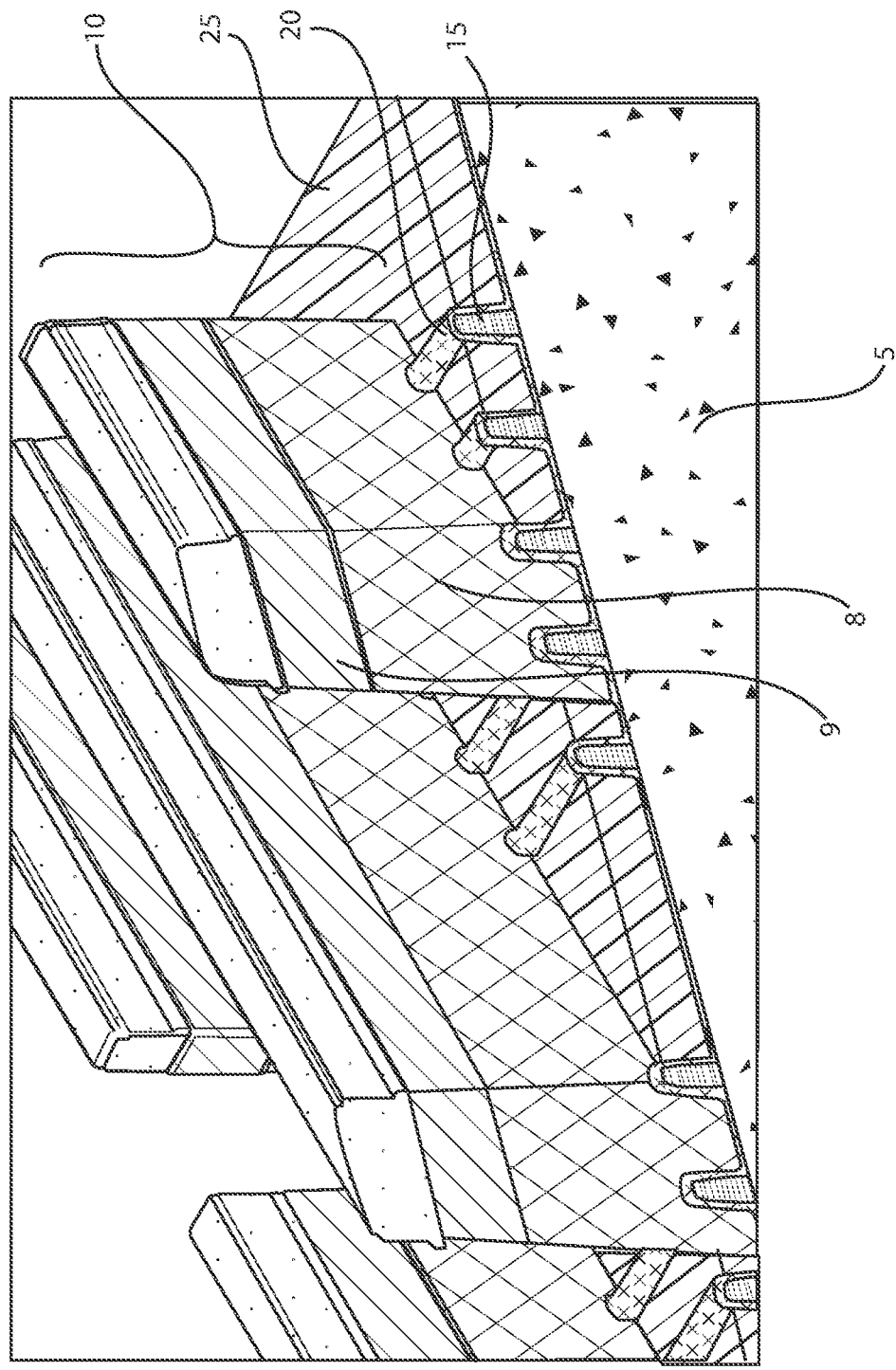
FIG. 2 is a perspective cross-sectional view depicting forming a flowable dielectric material being deposited on the source region portion and the drain region portion of the plurality of fin structures, wherein the flowable dielectric is present at least between adjacent fin structures of the plurality of fin structures filling a space between the adjacent fin structures, in accordance with one embodiment of the present disclosure.

FIG. 2 depicts one embodiment of forming a flowable dielectric material 25 being deposited over the source region portion and the drain region portion of the plurality of fin structures 15 and over the dielectric layer 20, wherein the flowable dielectric material 25 is present at least between adjacent fin structures of the plurality of fin structures 15 filling a space between the adjacent fin structures 15. The flowable dielectric material 25 may be an oxide, such as silicon oxide. It is noted that the composition for the flowable dielectric material is not limited to only oxides, as other dielectric materials may also be suitable for the flowable dielectric material 25. For example, the flowable dielectric material 25 may be composed of a low-k dielectric material. In some examples, the low-k dielectric that provides the flowable dielectric material 25 may have a dielectric constant of 4.0 or less (measured at room temperature, e.g., 25° C., and 1 atm). For example, a low-k dielectric material suitable for the flowable dielectric material 25 may have a dielectric constant ranging from about 1.0 to about 3.0. Examples of low-k materials suitable for the flowable dielectric material 25 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof.

The flowable dielectric material 25 is typically formed using spin on glass (SOG) deposition and flowable chemical vapor deposition (FCVD). Spin on glass (SOG) compositions typically includes silicon oxide ($SiO_2$) and optionally dopants (either boron or phosphorous) that is suspended in a solvent solution. The SOG is applied the deposition by spin-coating. Spin-coating is a process used to coat the deposition surface with material which is originally in the liquid form, wherein the liquid is dispensed onto the deposition surface in predetermined amount, and the wafer is rapidly rotated. For example, the deposition surface, e.g., substrate, may be rotated, i.e., spun, to speeds as great as 6,000 rpm. During spinning, liquid is uniformly distributed on the surface by centrifugal forces. The deposited material may then be solidified by a low temperature bake, e.g., baking at temperatures less than 200° C.

The flowable dielectric material 25 may also be deposited using flowable chemical vapor deposition (FCVD). The flowable dielectric material 25 deposited by flowable chemical vapor deposition (FCVD) may be a substantially carbon free silicon oxide ($SiO_2$) material. Flowable chemical vapor deposition (FCVD) provides for a liquid-like film that flows freely into trench like geometries to provide a bottom up, void-free and seam-free fill. Flowable chemical vapor deposition can fill gaps having aspect ratios of up to 30:1. One example, of a flowable chemical vapor deposition process is available from Applied Materials under the tradename Eterna FCVD system.

The flowable dielectric material 25 may be formed deposited to a height that is less than the height of the fin structures 15, or the flowable dielectric material 25 may be deposited to cover the fin structures 15, wherein the flowable dielectric material 25 may be later recessed using an etch process to expose the upper surfaces of the fin structures 15. The etch process for recessing the flowable dielectric material 25 may be an anisotropic etch, such as reactive ion etch (RIE).

Figure 3:
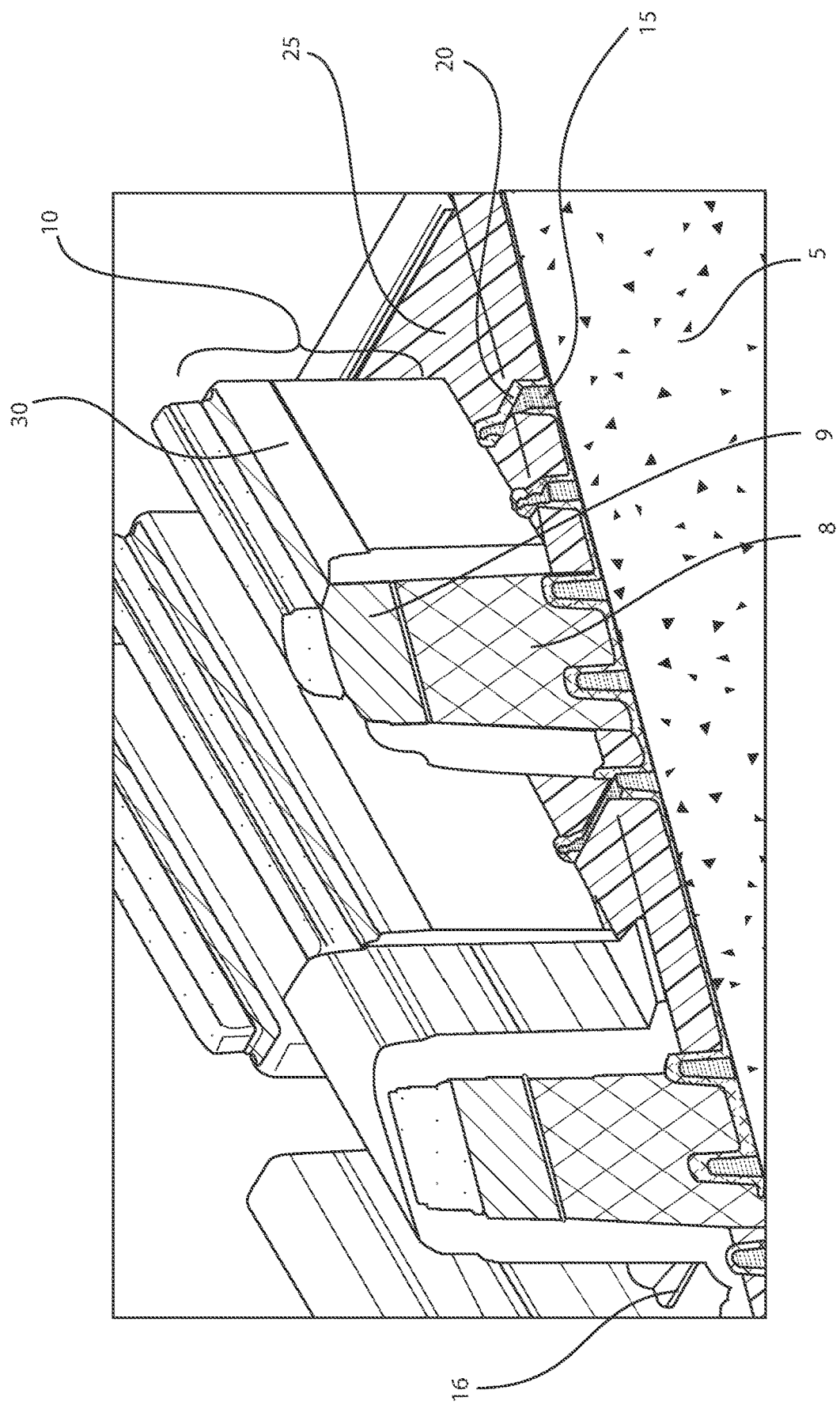
FIG. 3 is a perspective cross-sectional view depicting forming a spacer on a sidewall of the gate structure, in accordance with one embodiment of the present disclosure.

FIG. 3 depicts forming a gate sidewall spacer 30 on a sidewall of the gate structure 10. In one embodiment, the gate sidewall spacer 30 may be formed by using a blanket layer deposition, such as chemical vapor deposition (CVD), and an anisotropic etchback method. The gate sidewall spacer 30 may have a width ranging from 2.0 nm to 15.0 nm, and may be composed of a dielectric, such as a nitride, oxide, oxynitride, or a combination thereof. In one example, the gate sidewall dielectric spacer 30 is composed of silicon oxide ($SiO_2$). The flowable dielectric material 25 protects the sidewalls and lower portion of the fin structures 15 from being damages by the etch process that forms the gate sidewall spacer 30.

FIG. 3 also depicts removing the dielectric layer 20 from the upper surface of at least one of the fin structures 15. The dielectric layer 20 may be removed by an etch that is selective to the gate sidewall spacer 30, and the flowable dielectric material 25. The term "selective" as used to describe a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. The etch process for removing the exposed portions of the dielectric layer 20 may be an anisotropic etch or an isotropic etch. In some examples, the etch process may be a wet chemical etch, reactive ion etch (RIE), plasma etch, laser etch and combinations thereof. In some embodiments, the dielectric layer 20 may remain on the upper surface of some of the fin structures 15 by protecting those fin structures 15 with a etch mask, such as a photoresist mask 16.

Figure 4:
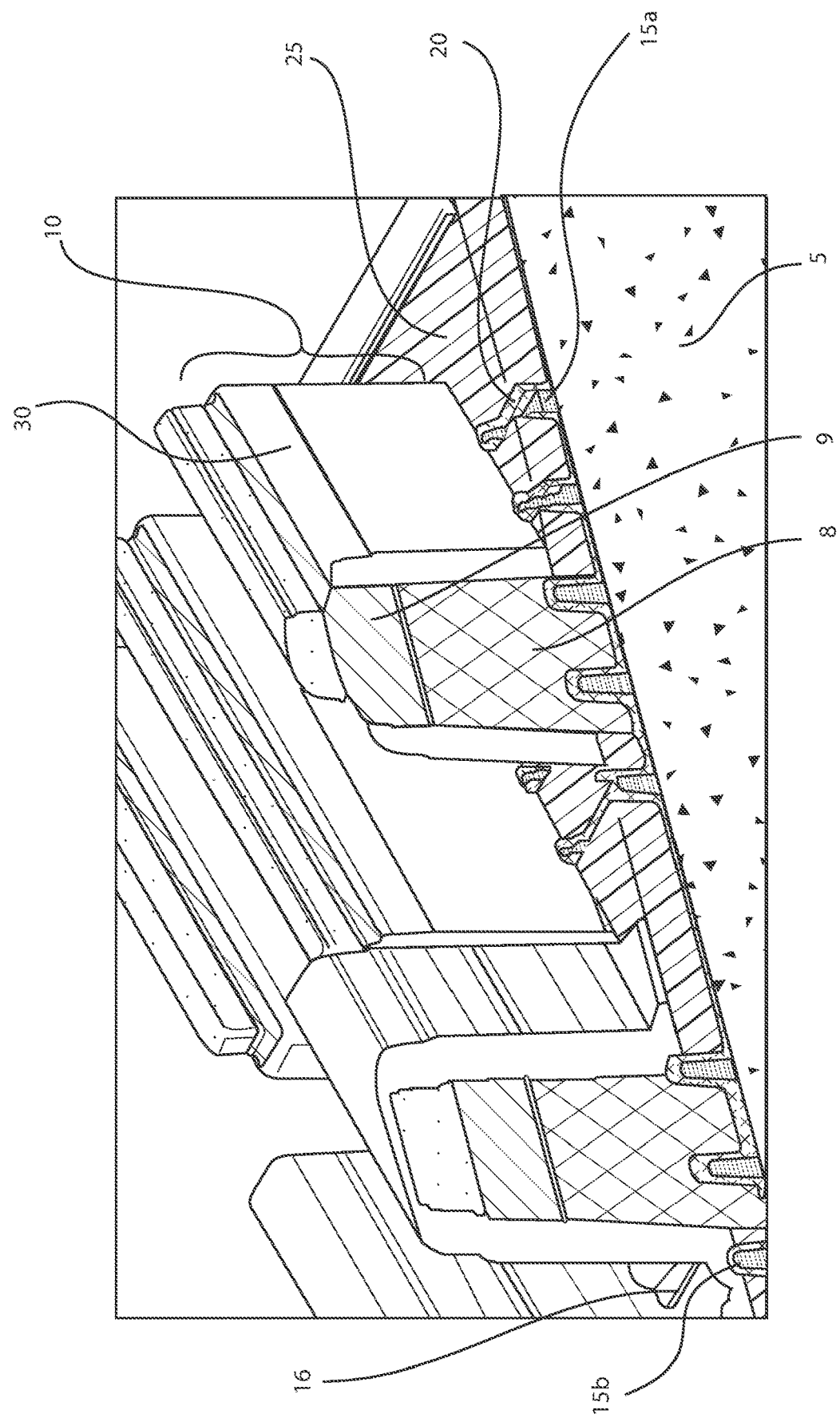
FIG. 4 is a perspective cross-sectional view depicting recessing an upper surface of a fin structure, in accordance with one embodiment of the present disclosure.

FIG. 4 is a perspective cross-sectional view depicting one embodiment of recessing an upper surface of a fin structure 15a. In the embodiment that is depicted in FIG. 4, the fin structures 15a being recessed are the fin structures 15a for semiconductor devices processed to have a p-type conductivity, e.g., p-type fin field effect transistors (p-type FinFETs). By p-type it is meant that the source and drain region portions of the fin structures 15a have been doped with a p-type conductivity dopant. As used herein, the term "drain region" means a doped region in semiconductor device located at the end of the functional channel region, in which carriers are flowing out of the transistor through the drain region. The term "source region" is a doped region in the semiconductor device, in which majority carriers are flowing into the channel region. P-type conductivity source and drain regions may be produced in a fin structure 15a of a type IV semiconductor, such as a silicon including semiconductor or a germanium including semiconductor, by doping the type IV semiconductor material with group III-A elements of the periodic table of elements, such as boron (B).

The upper surface of the fin structures 15a for the p-type FinFETs may be recessed using an anisotropic etch process, such as reactive ion etch (RIE). Other etch processes for recessing the upper surface of the fin structures 15a may include plasma etching or laser etching. In some embodiments, in which the structure is being processed to provide p-type FinFETs and n-type FinFETs simultaneously on the same substrate, such as in a complementary metal oxide semiconductor (CMOS) arrangement, some of the fin structures 15b may be protected from being etched by an etch mask 16. For example, as depicted in FIGS. 3 and 4, an etch mask 16 may be present over the fin structures 15b that are subsequently processed to provide an n-type conductivity semiconductor device, such as an n-type FinFET. By "n-type" it is meant that the source and drain region portions of the fin structures 15b have been doped with an n-type conductivity dopant. An n-type conductivity may be produced in fin structure 15b composed of a type IV semiconductor, such as a silicon including semiconductor or a germanium including semiconductor, by doping the type IV semiconductor material with group V elements of the periodic table of elements, such as phosphorus (P) or arsenic (As).

It is noted that the recessing of the fin structures 15a depicted in FIG. 4 is optional. The step of recessing the fin structures 15a may be omitted.

Figure 5:
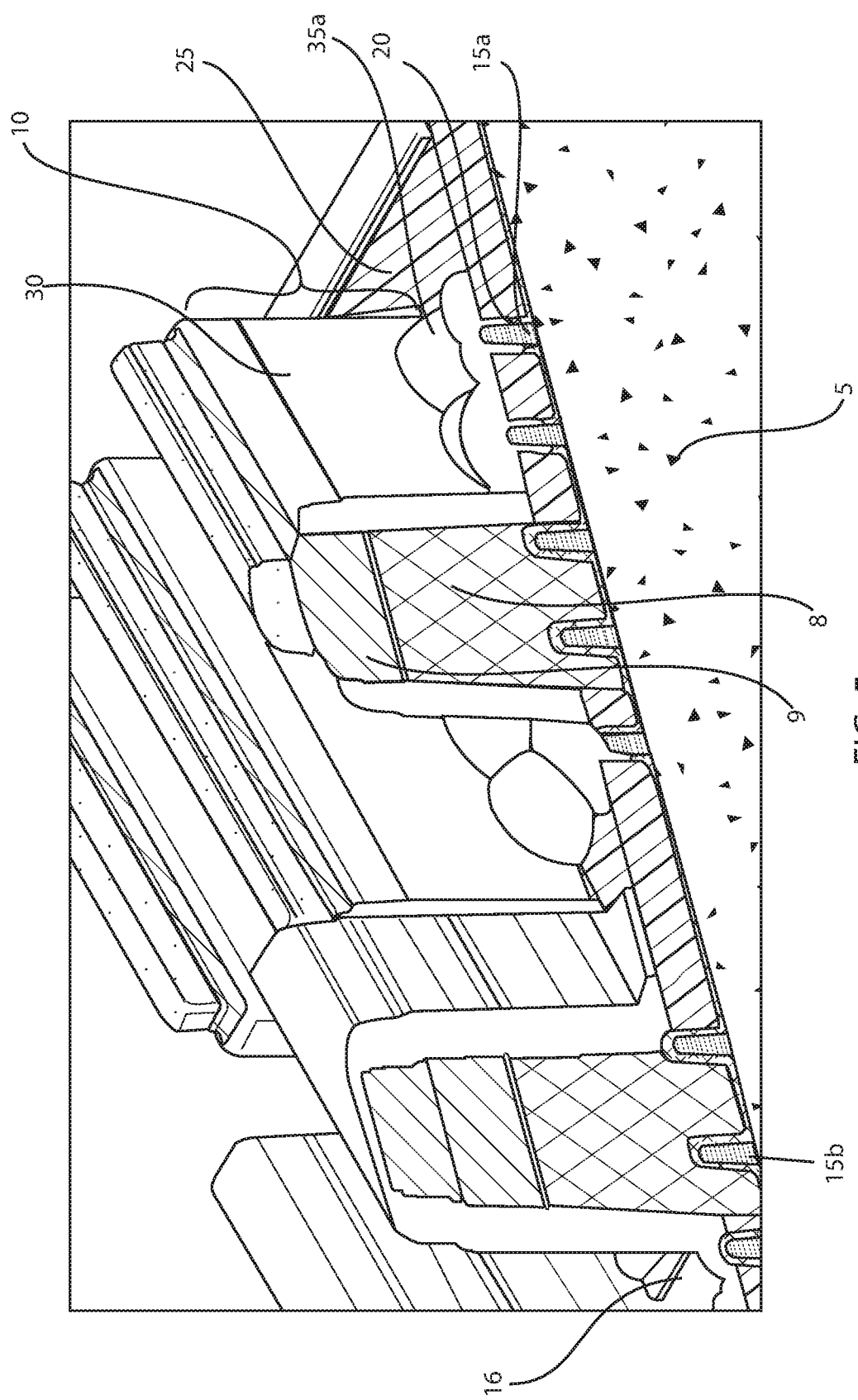
FIG. 5 is a perspective cross-sectional view depicting one embodiment of forming a first epitaxial semiconductor material on the upper surface of the source region portion and the drain region portion of the fin structures having a p-type conductivity, in accordance with the present disclosure.

FIG. 5 depicts one embodiment of forming a first epitaxial semiconductor material 35a on the upper surface of the source region portion and the drain region portion of the fin structures 15a having a p-type conductivity. The first epitaxial semiconductor material 35a is typically formed using an epitaxial growth and/or deposition process. "Epitaxial growth and/or deposition" means the growth of a semiconductor material on a deposition surface of a semiconductor material, in which the semiconductor material being grown has substantially the same crystalline characteristics as the semiconductor material of the deposition surface. An epitaxial material is a material that has been deposited using an epitaxial deposition process, and therefore has the characteristics of an epitaxially deposited material, such as having the substantially the same crystalline characteristics as the semiconductor material of the deposition surface. In some embodiments, when the chemical reactants are controlled and the system parameters set correctly, the depositing atoms of an epitaxial deposition process arrive at the deposition surface with sufficient energy to move around on the surface and orient themselves to the crystal arrangement of the atoms of the deposition surface. For example, an epitaxial film deposited on a {100} crystal surface will take on a {100} orientation.

Typically, the epitaxial growth and/or deposition process that provides the first epitaxial semiconductor material 35a is a selective deposition process that will not deposit the epitaxial material on dielectric surfaces, such as the etch mask 16 that is present over the fin structures 15b that are subsequently processed to provide a p-type FinFET.

The first epitaxial semiconductor material 35a may be a type IV semiconductor material, such as a silicon including material, or may be a compound semiconductor, such as a type III-V semiconductor material. For example, when the first epitaxial semiconductor material 35a is a type IV semiconductor material, the first epitaxial semiconductor material 35a may be silicon, single crystal silicon, multicrystalline silicon, polycrystalline silicon, silicon doped with carbon (Si:C), germanium (Ge), silicon germanium (SiGe), silicon germanium doped with carbon (SiGe:C) and combinations thereof. In some cases, a silicon germanium tin material (SiGeSb) may be used to further tune the crystal lattice and electrical properties of the epitaxial film. When the first epitaxial semiconductor material 35a is a compound semiconductor, such as a type III-V semiconductor material, the compound semiconductor material may be selected from the group consisting of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof. It is noted that the above examples of compositions for the epitaxial material that provide the in situ doped semiconductor material 10 are provided for illustrative purposes only, and are not intended to be limitation. Other material compositions may be equally suitable for use with the present disclosure.

In some embodiments, when the fin structures 15a are being processed to provide a p-type FinFET, the first epitaxial semiconductor material 35a may be composed of silicon and germanium including material, such as silicon germanium. In some embodiments, in which the semiconductor material that forms the first epitaxial semiconductor material 35a is composed of silicon (Si) and germanium (Ge), the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof. It is noted that the above examples of source gasses for deposition of epitaxial material are provided for illustrative purposes only, and are not intended to be limitation. Other deposition source gasses may be equally suitable for use with the present disclosure.

In some embodiments, forming a silicon germanium (SiGe) first epitaxial semiconductor material 35a on a silicon upper surface of the fin structures 15a produces a compressive strain in the channel region of the p-type FinFET that increases hole carrier mobility. Increasing hole carrier mobility increases switching speed for p-type FinFET devices. In the embodiments, in which the upper surface of the fin structures 15a has been recessed, the silicon germanium first epitaxial semiconductor material 35a is brought into closer proximity to the channel region of the fin structures 15a, which further increases the amount of compressive strain that is induced upon the channel region of the device.

In some embodiments, the first epitaxial semiconductor material 35a may be doped, wherein the dopant may be introduced to the first epitaxial semiconductor material 35a using an in-situ doping process. In the embodiments, in which the fin structures 15a are processed to provide p-type FinFETs, the first epitaxial semiconductor material 35a may be doped to a p-type conductivity. By "in-situ" it is meant that the dopant that dictates the conductivity type, i.e., n-type or p-type, of the semiconductor material is introduced during the process step that forms the semiconductor material. For example, the dopant that dictates the conductivity type of the first epitaxial semiconductor material 35a may be introduced during the epitaxial deposition process that forms the material layer for the first epitaxial semiconductor material 35a. The p-type gas dopant source employed in the epitaxial deposition process for forming the first epitaxial semiconductor material 35a may include diborane ($B_2H_6$). In some embodiments, an anneal process may drive the dopant, e.g., p-type dopant, from the first epitaxial semiconductor material into the source and drain region portions of the fin structure 15a.

The thickness of the first epitaxial semiconductor material 35a may range from 5 nm to 100 nm, depending on structural constraints and the dimensions of the fin and gate. Preferentially the thickness of the first epitaxial layer is between 10 nm to 50 nm.

In some embodiments, the first epitaxial semiconductor material 35a may extend from the upper surface of a first fin structure 15a over and atop the flowable dielectric material 25 into contact with the upper surface of an adjacent fin structure 15a to provide an epitaxial fin merge structure, as depicted in FIG. 5. It is noted that embodiments have been contemplated that includes a first epitaxial semiconductor material 35a for each fin structure 15a that does not contact their adjacent fin structures.

Figure 6:
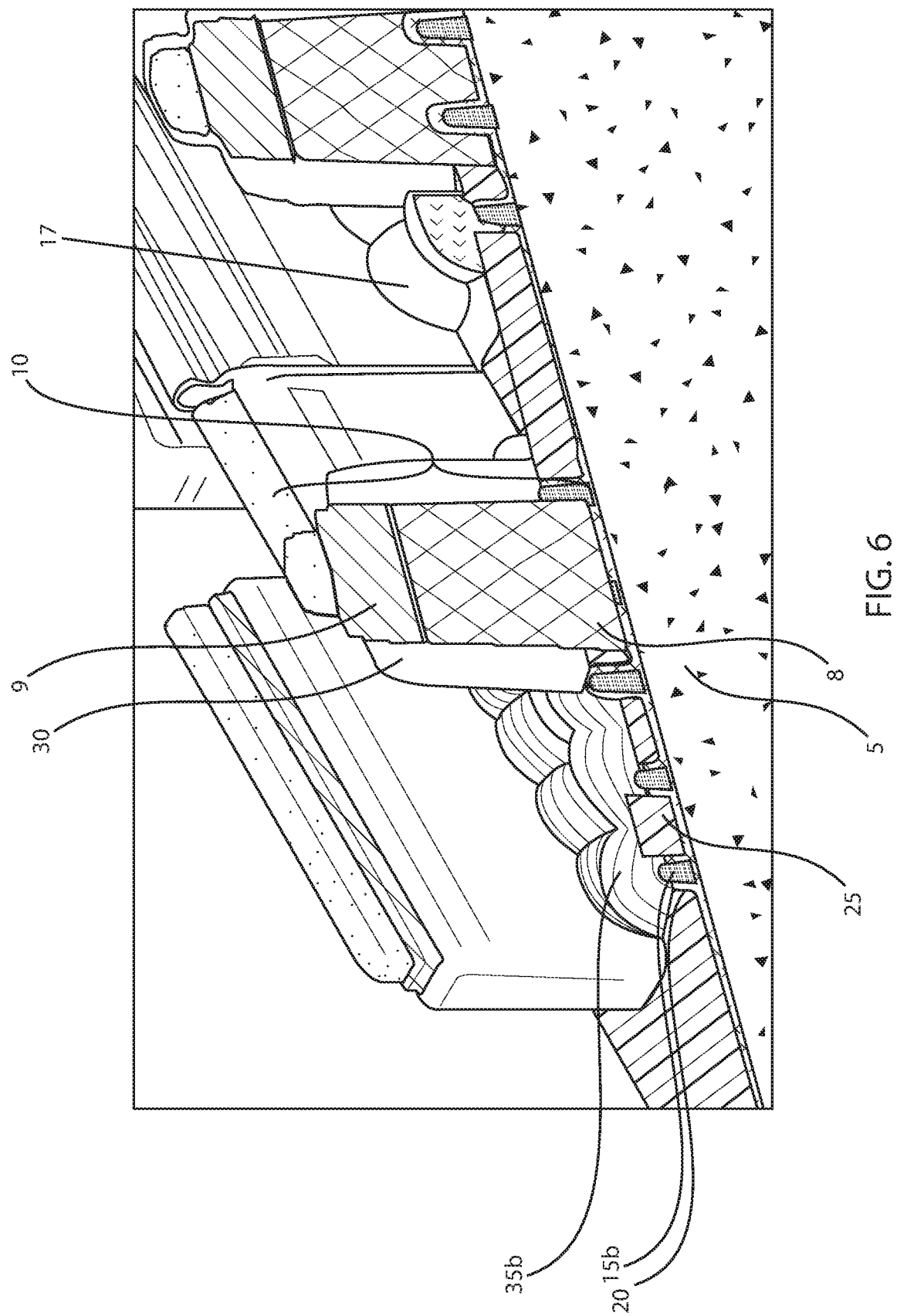
FIG. 6 is a perspective cross-sectional view depicting forming a second epitaxial semiconductor material on the upper surface of the source region portion and the drain region portion of the fin structures having an n-type conductivity, in accordance with one embodiment of the present disclosure.

FIG. 6 depicts forming a second epitaxial semiconductor material 35b on the upper surface of the source region portion and the drain region portion of the fin structures 15b that are subsequently processed to provide n-type FinFETs. In some embodiments, prior to forming the second epitaxial semiconductor material 35b, a block mask 17, such as a photoresist mask, may be formed over the fin structures 15a that are processed to provide the p-type FinFET. The block mask 17 obstructs the second epitaxial material 35b from being formed on the first epitaxial material 35a.

Similar to the first epitaxial semiconductor material 35a, the second epitaxial semiconductor material 35b may be composed of a type IV material, such as silicon, germanium, or silicon germanium, or a compound semiconductor, such as a type III-V semiconductor material, e.g., GaAs. Therefore, the above descriptions for the semiconductor material for the first epitaxial semiconductor material 35a is suitable for the description of the materials that may be suitable for the second epitaxial semiconductor material 35b.

In some embodiments, when the fin structures 15b are being processed to provide n-type FinFETs, the second epitaxial semiconductor material 35b may be composed of silicon or silicon doped with carbon (Si:C) material. In some embodiments, in which the semiconductor material that forms the second epitaxial semiconductor material 35b is composed of silicon (Si), the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. When the second epitaxial semiconductor material 35b is composed of silicon doped with carbon, a carbon source may be added to deposition chamber with the above described silicon sources. Carbon sources, i.e., carbon containing precursors, that are useful to deposit silicon containing compounds include organosilanes, alkyls, alkenes and alkynes of ethyl, propyl and butyl. Such carbon sources include methylsilane ($CH_3SiH_3$), dimethylsilane (($CH_3)_2SiH_2$), ethylsilane ($CH_3CH_2SiH_3$), methane ($CH_4$), ethylene ($C_2H_4$), ethyne ($C_2H_2$), propane ($C_3H_8$), propene ($C_3H_6$), butyne ($C_4H_6$), as well as others. The carbon (C) content of the epitaxial grown silicon doped with carbon (Si:C) may range from 0.3% to 5%, by atomic weight %. In another embodiment, the carbon content of the epitaxial grown silicon doped with carbon (Si:C) may range from 1% to 2%. Other deposition source gasses may be equally suitable for use with the present disclosure.

In some embodiments, forming a second epitaxial semiconductor material 35b composed of silicon doped with carbon (Si:C) on a silicon upper surface of the fin structures 15b produces a tensile strain in the channel region of the n-type FinFET that increases electron carrier mobility. Increasing electron carrier mobility increases switching speed for n-type FinFET devices. In the embodiments, in which the upper surface of the fin structures 15b has been recessed, the second epitaxial semiconductor material 35b is brought into closer proximity to the channel region of the fin structures 15b, which further increases the amount of tensile strain that is induced upon the channel region of the device.

In some embodiments, the second epitaxial semiconductor material 35b may be doped, wherein the dopant is introduced to the second epitaxial semiconductor material 35b using an in-situ doping process. In the embodiments, in which the fin structures 15b are processed to provide n-type FinFETs, the first epitaxial semiconductor material 35a may be doped to an n-type conductivity. In one embodiment, the n-type gas dopant source may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines suitable for use with the present disclosure include trimethylphosphine (($CH_3)_3P$), dimethylphosphine (($CH_3)_2PH$), triethylphosphine (($CH_3CH_2)_3P$) and diethylphosphine (($CH_3CH_2)_2PH$). In some embodiments, an anneal process may drive the dopant, e.g., n-type dopant, from the second epitaxial semiconductor material 35b into the source and drain region portions of the fin structure 15b.

The thickness of the second epitaxial semiconductor material 35b may range from 5 nm to 100 nm, depending on structural constraints and the dimensions of the fin and gate. Preferentially the thickness of the first epitaxial layer is between 10 nm to 50 nm.

In some embodiment, the second epitaxial semiconductor material 35b may extend from the upper surface of a first fin structure 15a, 15b over and atop the flowable dielectric material 25 into contact with the upper surface of an adjacent fin structure 15a, 15b to provide an epitaxial fin merge structure, as depicted in FIG. 6. It is noted that embodiments have been contemplated that include a second epitaxial semiconductor material 35b for each fin structure 15b that does not contact their adjacent fin structures.

Figure 7:
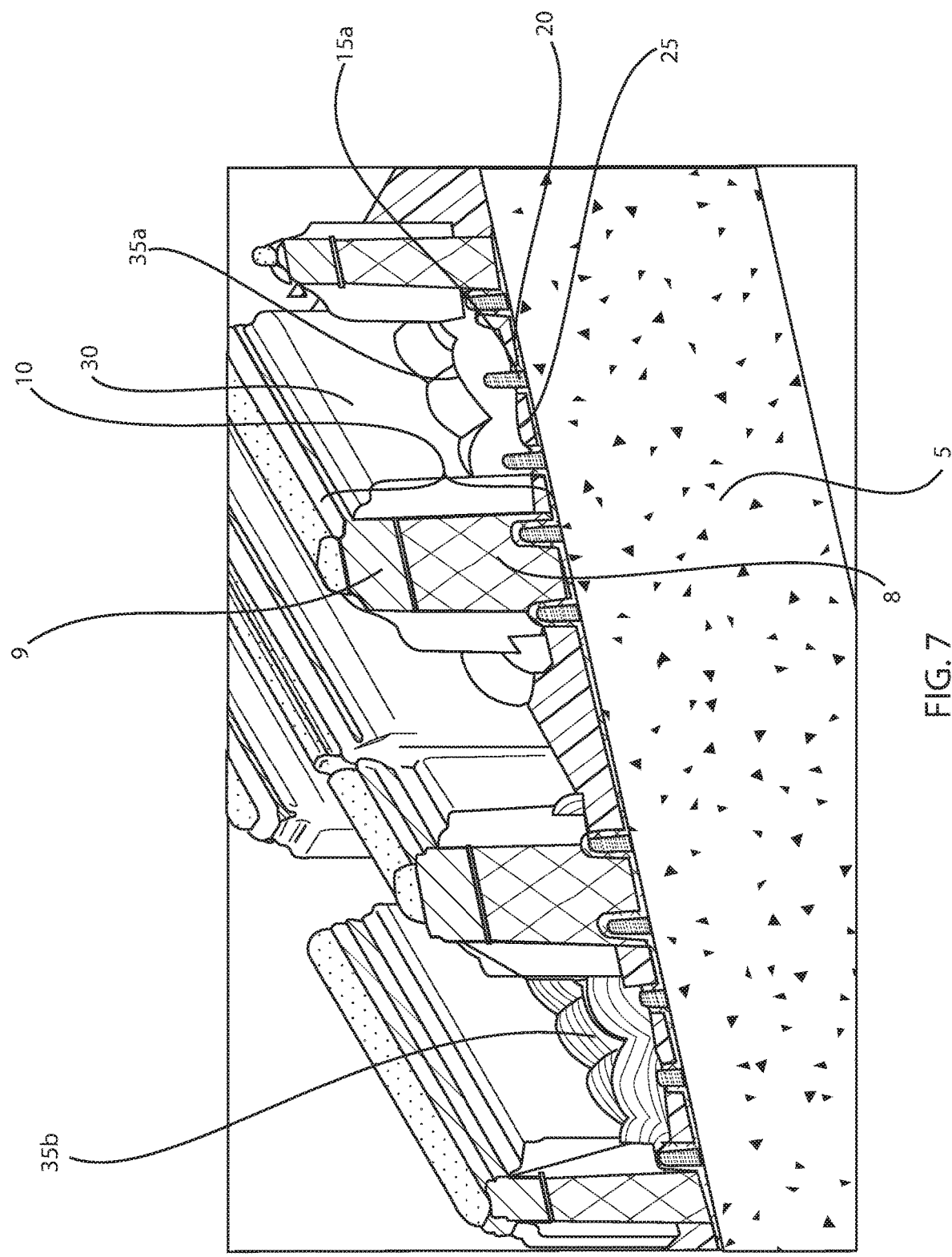
FIG. 7 is a perspective cross-sectional view depicting removing a block mask from the first epitaxial semiconductor material after forming the second epitaxial semiconductor material, in accordance with one embodiment of the present disclosure.

FIG. 7 depicts removing the block mask 17 from the first epitaxial semiconductor material 35a after forming the second epitaxial semiconductor material 35b. The block mask 17 may be removed using selective etching or chemical stripping.

In the embodiments in which the gate structures 10 to the device are formed using a gate last process flow, the sacrificial gate structure (also referred to as replacement gate structure) may be removed at this stage of the process flow. More specifically, an interlevel dielectric layer (not shown) may be blanket deposited over the structure depicted in FIG. 7 and planarized to expose an upper surface of the sacrificial gate structure. The sacrificial gate structure may then be removed using an etch that is selective to the interlevel dielectric layer, the gate sidewall spacers 30 and the channel region portions of the fin structures 15a, 15b. A functional gate structure including at least one gate dielectric and at least one gate conductor may then be formed in the space provided by removing the sacrificial gate structure. The functional gate structure typically includes at least one gate dielectric that is present on the channel region portions of the fin structures 15a, 15b, and at least one gate conductor on the at least one gate dielectric.

FIG. 7 depicts one embodiment of a semiconductor device that includes a gate structure 10 present on a channel region portion of a plurality of fin structures 15a, 15b. A flowable dielectric 25 is present filling the space between adjacent fin structures 15a, 15b. Epitaxial source and drain merge structures 35a, 35b are present on an exposed upper surface of the fin structures 15a, 15b. The epitaxial source and drain merge structures 35a, 35b extend over the flowable dielectric material 25 that is present filling the space between adjacent fin structures 15a, 15b.

FIG. 8A is a perspective cross-sectional side view of the fin structure 15b of the n-type FinFET that is parallel to a length of the gate structure 10. FIG. 8a depicts a second epitaxial semiconductor material 35b on the upper surface of the fin structure 15b. FIG. 8b is a perspective cross-sectional side view of the fin structure 15a of the p-type FinFET parallel to a length of the gate structure 10. FIG. 8b depicts a first epitaxial semiconductor material 35a on the upper surface of the fin structure 15a. FIG. 8B depicts that the upper surface of the fin structure 15a that the first epitaxial semiconductor material 35a is present on is recessed from the upper surface of the channel region portion of the fin structure 15a by a dimension D1 ranging from 1 nm to 100 nm. In another example, the upper surface of the fin structure 15a that the first epitaxial semiconductor material 35a is present on is recessed from the upper surface of the channel region portion of the fin structure 15b by a dimension D1 ranging from 20 nm to 40 nm. FIG. 8C is a perspective cross-sectional side view perpendicular to the length of the gate structures 10 depicting the first and second epitaxial semiconductor materials 35a, 35b on the fin structures 15a, 15b that is depicted in FIG. 7.

In some embodiments, the methods and structures disclosed herein introduce a flowable dielectric material 25 into the space separating adjacent fin structures 15a, 15b. In some embodiments, by covering the lower part of the fin structures 15a, 15b, the fin structures 15a, 15b are protected against contamination from the etch processes, such as reactive ion etch (RIE) processes, that are used to form the gate sidewall spacer 30. Further, by limiting the number of epitaxial semiconductor crystal growth planes that are available, the methods and structures that are disclosed herein allow for forming a layered epitaxial semiconductor material 35c, 35d, 35e that includes a buffer layer portion 35c, a main portion 35d and a cap layer portion 35e. In some embodiments, by constraining the epitaxial growth so that the semiconductor material 35a, 35b, 35c, 35d, 35e does not extend down the sidewalls of the fin structures 15a, 15b, the methods and structures disclosed herein may limit the source and drain region to gate capacitance.

Figure 9:
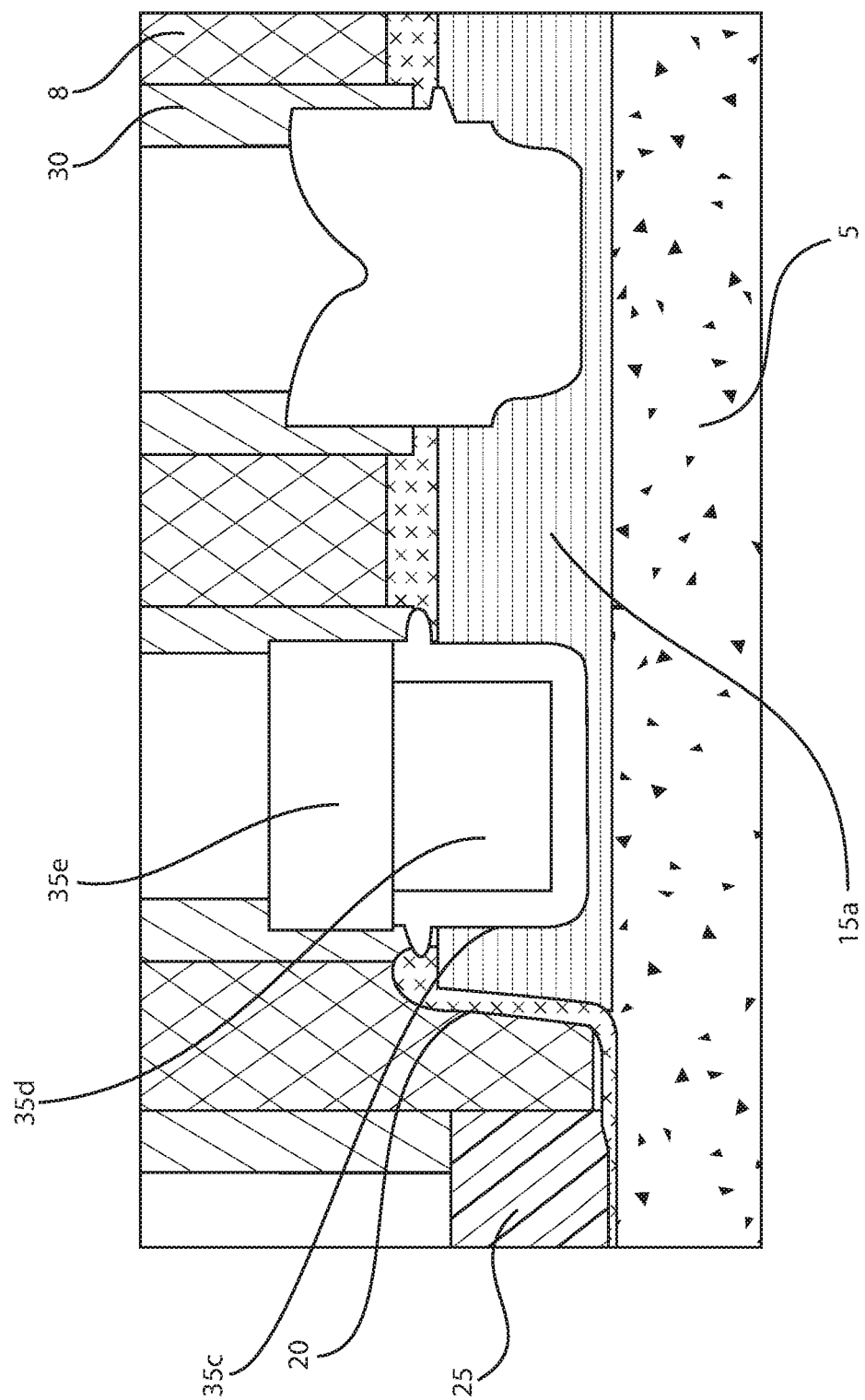
FIG. 9 is side cross-sectional view of another embodiment of an epitaxial material formed in accordance with the present disclosure, wherein the epitaxial material includes a buffer layer portion, a main portion and a cap layer portion, in accordance with the present disclosure.

FIG. 9 depicts another embodiment of an epitaxial semiconductor material formed in accordance with the present disclosure, in which the epitaxial semiconductor material includes a buffer layer portion 35c, a main portion 35d, and a cap layer portion 35e. In the embodiment that is depicted in FIG. 9, the epitaxial material 35c, 35d, 35e is formed on a recessed surface of a fin structure 15a. In one embodiment, the buffer layer portion 35c has a conformal thickness on the recessed upper surface of the fin structure 15a, as well as having a conformal thickness on the sidewall portions of the fin structure 15a that extend for the upper surface of the fin structure 15a that has not been recessed to the recessed surfaces of the fin structure 15a. The main portion 35d fills the void, i.e., trench, that is formed by recessing the upper surface of the fin structure 15a. The cap layer portion 35e is present atop the main portion 35d and provides a contact to the epitaxial semiconductor material 35c, 35d, 35e. In one embodiment, the buffer layer would provide a growth nucleation and dopant out-diffusion control (for instance, 20% to 50% germanium (Ge) and 0 to $1 \times 10^{20}$ atoms/cm$^3$ boron (B)), the main layer would provide channel stress and a high concentration of dopants for out-diffusion (for instance, 30% to 70% germanium (Ge), $2 \times 10^{20}$ atoms/cm$^3$ to $2 \times 10^{21}$ atoms/cm$^3$ boron (B)), and the cap layer provides erosion protection and improved silicide contact resistance (for instance, 0% to 30% germanium (Ge), 0 to $2 \times 10^{20}$ atoms/cm$^3$ boron (B)). It is noted that the above example is just one possible layer structure, as that other layer structures or gradient structures may also be used in accordance with the present disclosure to provide the same or other benefits. The epitaxial semiconductor material 35c, 35d, 35e may be in the geometry of a source and drain epitaxial merge structures that extend into contact with adjacent fin structures 15a, 15b. In another embodiment, each fin structure 15a, 15b includes separate epitaxial semiconductor material 35c, 35d, 35e.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor device, comprising:
   a gate structure present on a channel region portion of a plurality of fin structures, the gate structure formed over a substrate;
   a flowable dielectric material present filling a space between adjacent fin structures in the plurality of fin structures;
   a dielectric material encompassing the plurality of fins structures; and
   a first epitaxial merge structure formed over a first set of the plurality of fin structures and a second epitaxial merge structure formed over a second set of the plurality of fin structures, wherein the first and second epitaxial merge structures are separate and distinct from each other and each extend over portions of the flowable dielectric material, and wherein the first epitaxial merge structure includes a buffer layer with semi-circular protrusions extending laterally from an upper portion thereof,
   wherein the dielectric material prevents direct contact between the plurality of fins and the flowable dielectric material, and
   wherein the dielectric material prevents directs contact between the flowable dielectric material and the substrate.

2. The semiconductor device of claim 1, wherein the flowable dielectric material includes an oxide.

3. The semiconductor device of claim 1, wherein the gate structure includes at least one gate dielectric and at least one gate conductor.

4. The semiconductor device of claim 1, wherein the first and second epitaxial merge structures are composed of silicon germanium, silicon doped with carbon, or a combination thereof.

5. The semiconductor device of claim 1, wherein the upper surface of the plurality of the fin structures is recessed.

6. The semiconductor device of claim 1, wherein a cap layer portion is disposed over the first epitaxial merge structure and in direct contact with upper surfaces of the buffer layer.

7. The semiconductor device of claim 1, wherein the flowable dielectric material includes a spin on glass, a flowable chemical vapor deposition (FCVD) or a combination thereof.

8. The semiconductor device of claim 1, further comprising a gate sidewall spacer on sidewalls of the gate structure formed after the flowable dielectric.

9. The semiconductor device of claim 1, wherein the first epitaxial merge structure includes silicon and germanium semiconductor material associated with p-type fin field effect transistors (FinFETs).

10. The semiconductor device of claim 1, wherein the second epitaxial merge structure includes silicon and carbon semiconductor material associate with n-type fin field effect transistors (FinFETs).

* * * * *